US008418556B2

(12) United States Patent
Chen et al.

(10) Patent No.: US 8,418,556 B2
(45) Date of Patent: Apr. 16, 2013

(54) MICRO ELECTRICAL MECHANICAL MAGNETIC FIELD SENSOR UTILIZING MODIFIED INERTIAL ELEMENTS

(75) Inventors: Po-Jui Chen, Sunnyvale, CA (US); Martin Eckardt, Stuttgart (DE); Axel Franke, Ditzingen (DE)

(73) Assignee: Robert Bosch GmbH, Stuttgart (DE)

( * ) Notice: Subject to any disclaimer, the term of this patent is extended or adjusted under 35 U.S.C. 154(b) by 508 days.

(21) Appl. No.: 12/703,516

(22) Filed: Feb. 10, 2010

(65) Prior Publication Data

US 2011/0192229 A1    Aug. 11, 2011

(51) Int. Cl.
*G01P 15/125* (2006.01)

(52) U.S. Cl.
USPC ................... 73/514.32; 73/514.37

(58) Field of Classification Search ............... 73/514.32, 73/510, 514.36, 514.37; 29/592.1
See application file for complete search history.

(56) References Cited

U.S. PATENT DOCUMENTS

| | | | | |
|---|---|---|---|---|
| 5,117,166 A * | 5/1992 | Kumar | ........................... | 318/362 |
| 5,517,093 A * | 5/1996 | Augustyniak et al. | .......... | 318/63 |
| 5,959,516 A * | 9/1999 | Chang et al. | ..................... | 334/14 |
| 6,215,318 B1* | 4/2001 | Schoefthaler et al. | ........ | 324/658 |
| 6,348,788 B1* | 2/2002 | Yao et al. | ..................... | 324/99 R |
| 6,441,581 B1* | 8/2002 | King et al. | ..................... | 320/101 |
| 6,486,627 B1* | 11/2002 | Gabrys | ......................... | 318/161 |
| 6,591,758 B2* | 7/2003 | Kumar | ........................... | 105/35 |
| 6,612,245 B2* | 9/2003 | Kumar et al. | .............. | 105/26.05 |
| 6,612,246 B2* | 9/2003 | Kumar | ......................... | 105/34.2 |
| 6,664,786 B2* | 12/2003 | Kretschmann et al. | ....... | 324/259 |
| 6,734,660 B1* | 5/2004 | Berkcan et al. | ........... | 324/117 R |
| 6,803,755 B2* | 10/2004 | Herbert et al. | .............. | 324/99 R |
| 7,049,806 B2* | 5/2006 | Herbert et al. | .............. | 324/99 R |
| 7,112,951 B2* | 9/2006 | Berkcan et al. | ............... | 324/126 |
| 7,741,832 B2* | 6/2010 | Berkcan et al. | ............... | 324/126 |
| 7,901,970 B2* | 3/2011 | Zribi et al. | ....................... | 438/52 |
| 2002/0021122 A1* | 2/2002 | Yao et al. | ..................... | 324/99 R |
| 2005/0270013 A1* | 12/2005 | Berkcan et al. | ............... | 324/126 |
| 2005/0270014 A1* | 12/2005 | Zribi et al. | ..................... | 324/126 |
| 2006/0076947 A1* | 4/2006 | Berkcan et al. | ............... | 324/126 |
| 2007/0120553 A1* | 5/2007 | Andarawis et al. | ........... | 324/126 |
| 2007/0181963 A1 | 8/2007 | Berkcan et al. | | |
| 2009/0139330 A1 | 6/2009 | Pavelescu et al. | | |

OTHER PUBLICATIONS

International Search Report in corresponding PCT Application (i.e., PCT/US2011/023927), mailed Apr. 7, 2011 (3 pages).
Kyynarainen et al., A 3D micromechanical compass, Sensors and Actuators A: Physical, 2008, pp. 561-568, 142, Elsevier, Vantaa, Finland, (8 pages).

\* cited by examiner

*Primary Examiner* — Peter J Macchiarolo
*Assistant Examiner* — Samir M Shah
(74) *Attorney, Agent, or Firm* — Maginot, Moore & Beck

(57) ABSTRACT

A micro electrical-mechanical system (MEMS) is disclosed. The MEMS includes a substrate, a first pivot extending upwardly from the substrate, a first lever arm with a first longitudinal axis extending above the substrate and pivotably mounted to the first pivot for pivoting about a first pivot axis, a first capacitor layer formed on the substrate at a location beneath a first capacitor portion of the first lever arm, a second capacitor layer formed on the substrate at a location beneath a second capacitor portion of the first lever arm, wherein the first pivot supports the first lever arm at a location between the first capacitor portion and the second capacitor portion along the first longitudinal axis, and a first conductor member extending across the first longitudinal axis and spaced apart from the first pivot axis.

20 Claims, 8 Drawing Sheets

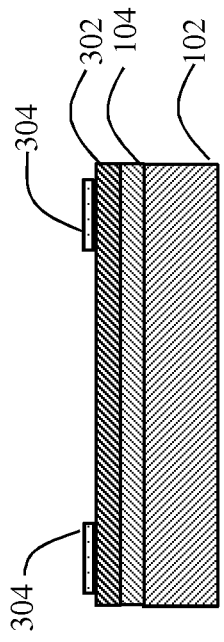
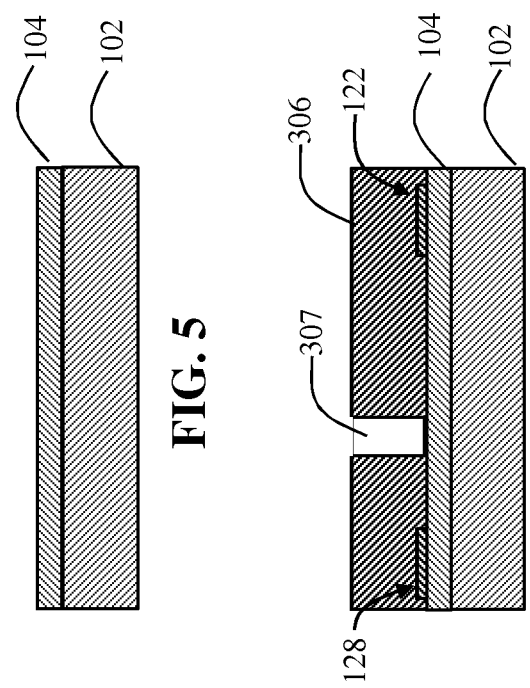
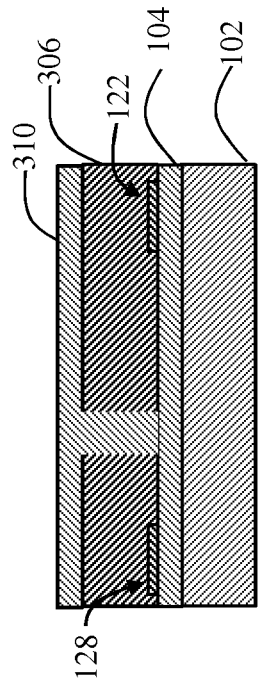
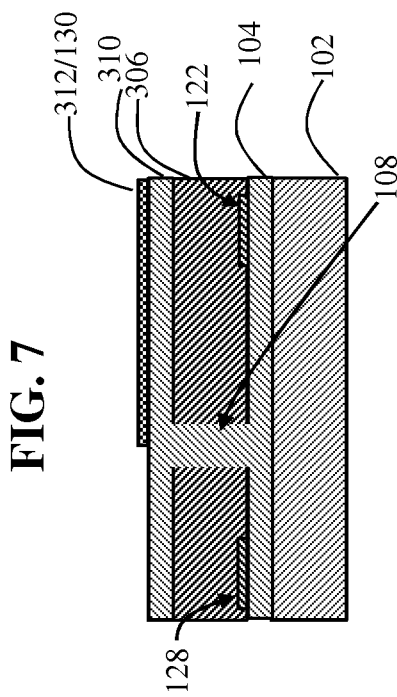

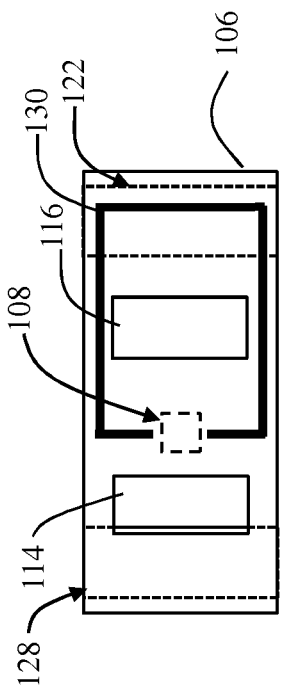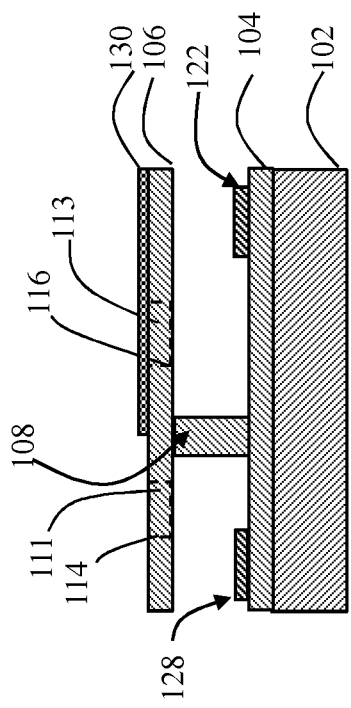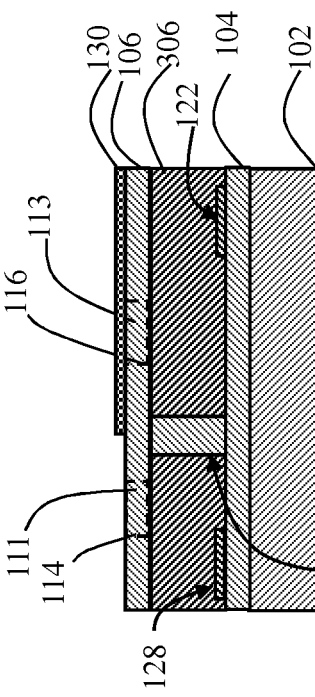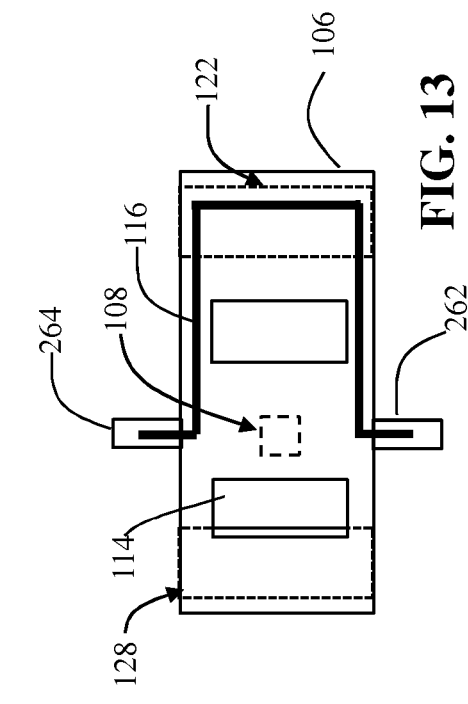

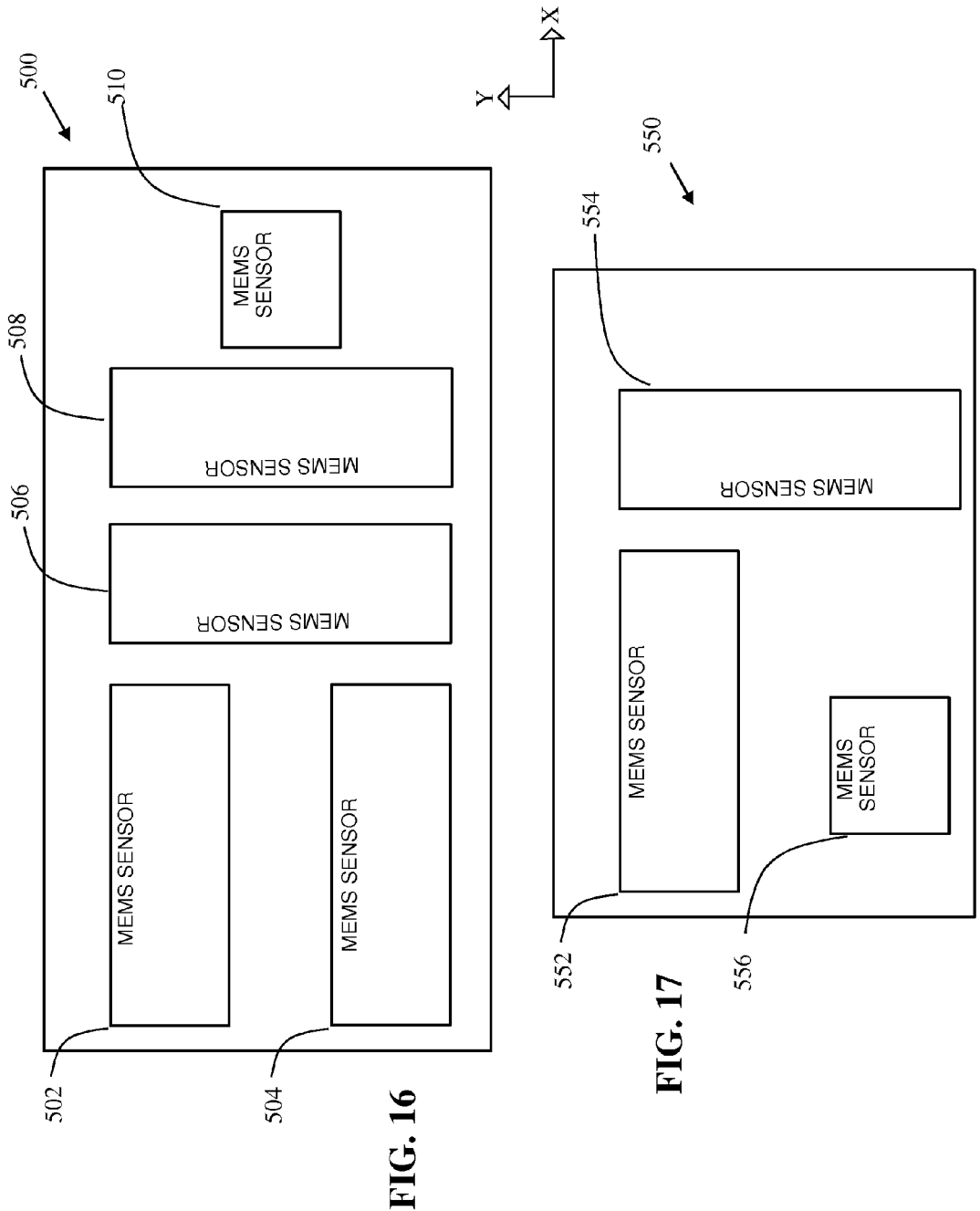

MICRO ELECTRICAL MECHANICAL MAGNETIC FIELD SENSOR UTILIZING MODIFIED INERTIAL ELEMENTS

FIELD

The present invention generally relates to devices that are used to measure magnetic field intensity and direction and more particularly to inertial sensing elements modified to sense in-plane magnetic fields.

BACKGROUND

Inertial sensing and magnetic field sensing are useful in a variety of different applications. Furthermore, inclusion of inertial sensing elements using micro electrical mechanical systems (MEMS) are continually finding new applications, e.g., attachments for video games and navigation systems to determine change of direction of the attachment. MEMS offer inexpensive solutions for these applications in a small package. Therefore, many MEMS-based inertial sensing elements can be used to increase sensitivity for determining directional acceleration of a moving object.

In the prior art it has been shown that using a seismic mass which includes a movable electrode that is arranged opposite to a fixed electrode can form a capacitor. Movement of the moveable electrode due to inertial forces resulting from an acceleration vector can result in changes in the capacitance. The change in the capacitance can be measured and correlated to the acceleration.

Similarly, various sensors are known that can correlate a perpendicular magnetic field to a change in electrical characteristics that can be measured to determine the magnitude of the magnetic field. However, the solutions provided in the prior art either lack the necessary sensitivity for effectively measuring magnetic fields that are parallel to the surface of a sensor or for measuring an acceleration vector that is perpendicular to the surface of the sensor.

A need exists to provide a MEMS-based sensor for effectively sensing magnetic fields that are tangential to the sensor and for sensing an acceleration vector that is perpendicular to the sensor.

SUMMARY

In accordance with one embodiment, a micro-electrical-mechanical system (MEMS) is disclosed. The MEMS includes a substrate, a first pivot extending upwardly from the substrate, a first lever arm with a first longitudinal axis extending above the substrate and pivotably mounted to the first pivot for pivoting about a first pivot axis, a first capacitor layer formed on the substrate at a location beneath a first capacitor portion of the first lever arm, a second capacitor layer formed on the substrate at a location beneath a second capacitor portion of the first lever arm, wherein the first pivot supports the first lever arm at a location between the first capacitor portion and the second capacitor portion along the first longitudinal axis, and a first conductor member extending across the first longitudinal axis and spaced apart from the first pivot axis.

In another embodiment, a method of forming a micro electrical-mechanical system (MEMS) is disclosed. The method includes providing a substrate, forming a first pivot extending upwardly from the substrate, forming a first lever arm with a first longitudinal axis extending above the substrate to be pivotably mounted to the first pivot for pivoting about a first pivot axis, forming a first capacitor layer on the substrate at a location selected to be beneath a first capacitor portion of the first lever arm, forming a second capacitor layer on the substrate at a location selected to be beneath a second capacitor portion of the first lever arm, and selected such that the first pivot will support the first lever arm at a location between the first capacitor portion and the second capacitor portion along the first longitudinal axis, and forming a first conductor member to extend across the first longitudinal axis at a location and to be spaced apart from the first pivot axis.

BRIEF DESCRIPTION OF THE DRAWINGS

The above described features and advantages, as well as others, will become more readily apparent to those of ordinary skill in the art by reference to the following detailed description and accompanying drawings.

FIGS. 5-14 depict fabrication steps for fabricating a MEMS sensor in accordance with one embodiment;

FIGS. 16 and 17 depict arrays of MEMS sensors placed on a common substrate for measuring magnetic fields and acceleration vectors of various directions.

DETAILED DESCRIPTION

Figure 1:
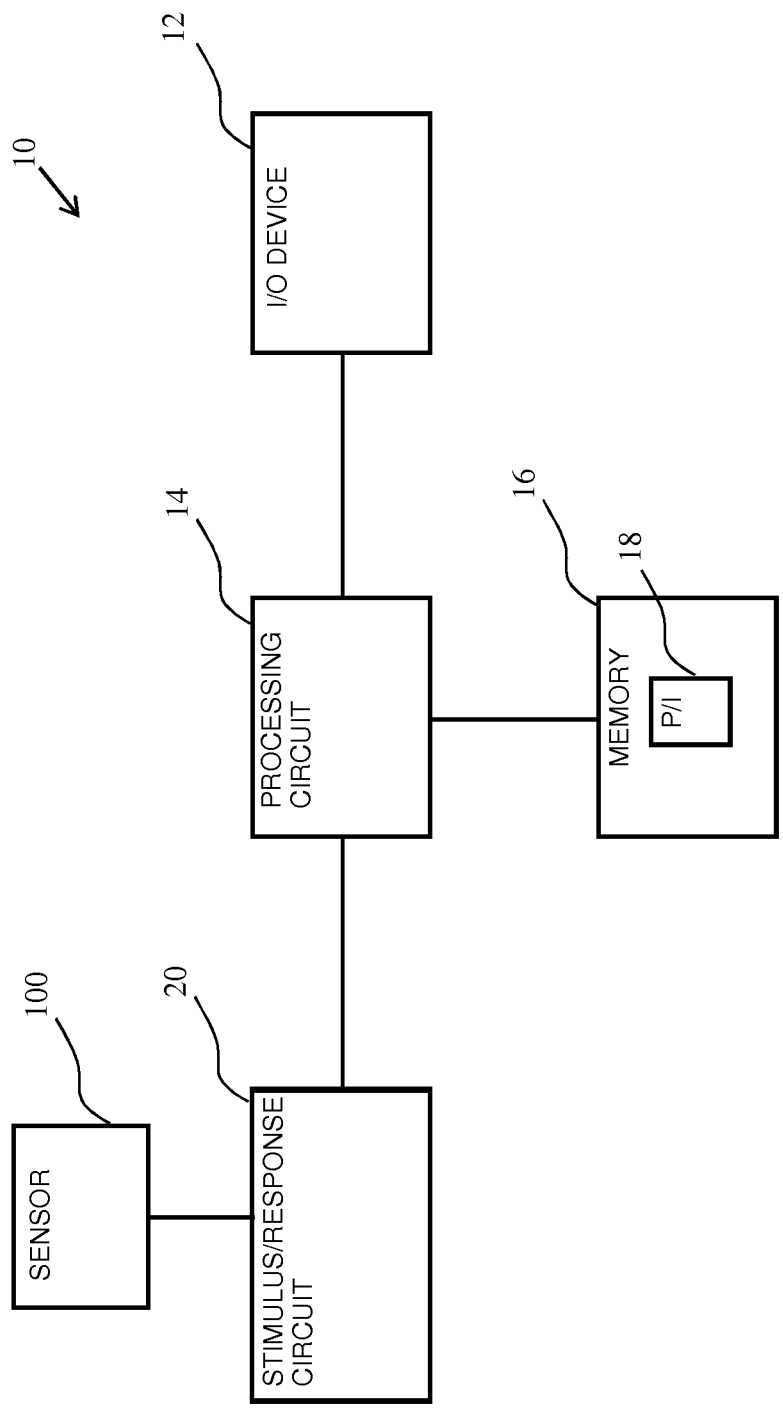
FIG. 1 depicts a block diagram of a micro electrical mechanical system (MEMS) including a micro electromechanical sensor.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

Referring to FIG. 1, there is depicted a representation of a circuit generally designated 10 for an in-plane magnetic field and/or out of plane acceleration sensing sensor (MEMS sensor). The circuit 10 includes an I/O device 12, a processing circuit 14 and a memory 16. The I/O device 12 may include a user interface, graphical user interface, keyboards, pointing devices, remote and/or local communication links, displays, and other devices that allow externally generated information to be provided to the circuit 10, and that allow internal information of the circuit 10 to be communicated externally.

The processing circuit 14 may suitably be a general purpose computer processing circuit such as a microprocessor and its associated circuitry. The processing circuit 14 is operable to carry out the operations attributed to it herein.

Within a memory 16 are various program instructions 18. The program instructions 18 are executable by the processing circuit 14 and/or any other components as appropriate.

The circuit 10 further includes a sensor stimulus/response circuit 20 connected to the processing circuit 14. The sensor stimulus/response circuit 20 provides a stimulus for a MEMS sensor 100 and measures the effects of the stimulus. The stimulus may be controlled by the processing circuit 14 and the measured value is communicated to the processing circuit 14.

Figure 2:
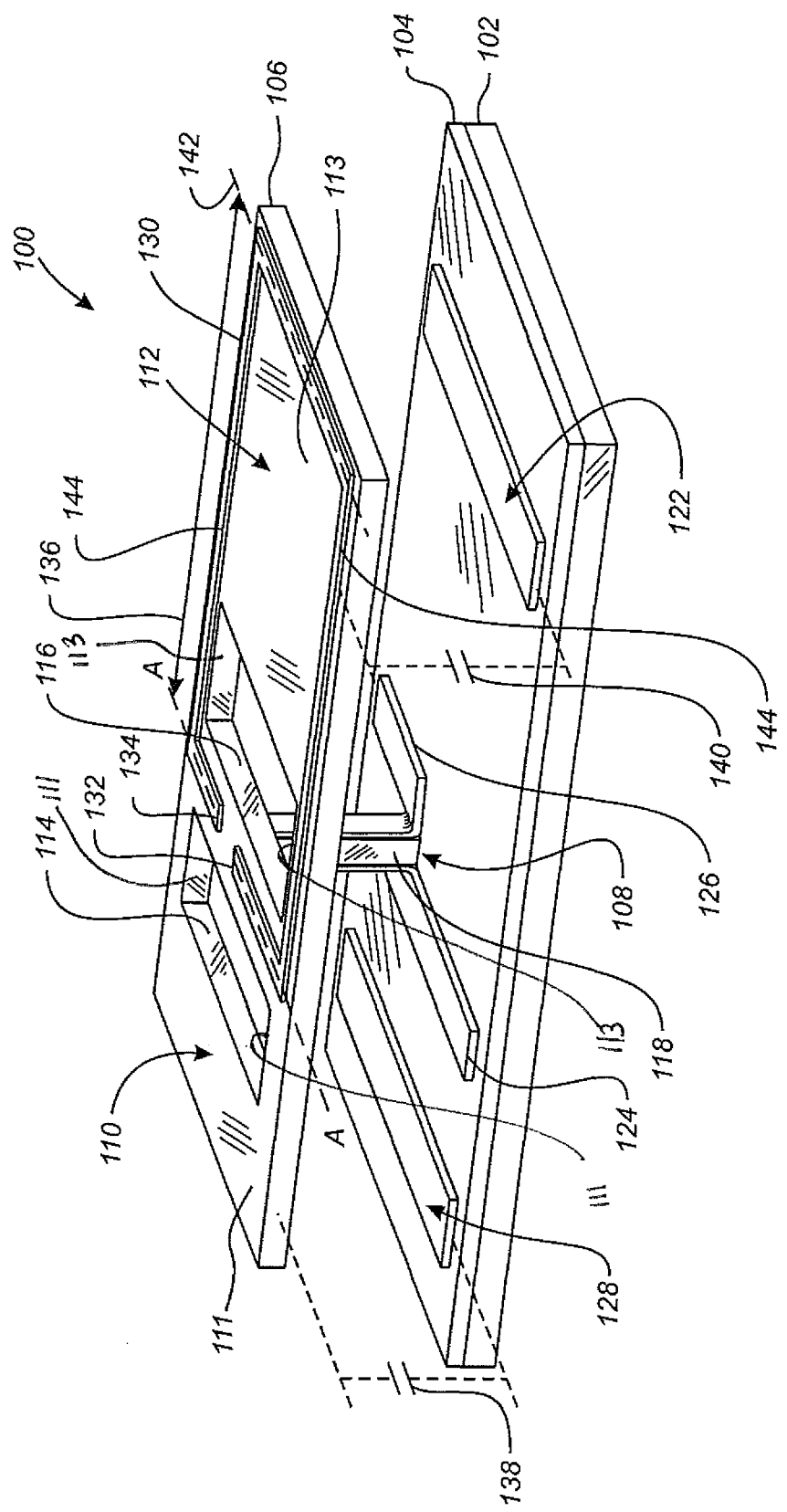
FIG. 2 depicts a perspective view of a MEMS sensor in accordance with one embodiment.

Referring to FIG. 2, a perspective view of the MEMS sensor 100 is depicted. A substrate 102 is provided. Examples of a suitable substrate material for the substrate 102 are silicon, glass, carbon, germanium, silicon carbide, and silicon germanium. The substrate 102 is electrically isolated by an isolation layer 104. Examples of suitable isolation material for the isolation layer 104 are silicon dioxide, and silicon nitride for use with a silicon substrate. A semiconductor layer 106 is provided in a suspended manner over the isolation layer 104 by way of a pivot member 108. An example of the material of the semiconductor layer 106 is undoped polysilicon. The pivot member 108 provides a pivoting function between the substrate/isolation layer 102/104 and the semiconductor layer 106 such that the semiconductor layer 106 can pivot about the pivot member 108. The pivot member 108 is below the dotted line designated as AA, dividing the semiconductor layer 106 into two lever arms 110 and 112. The length of each lever arm 110 and 112 runs along a longitudinal axis, e.g., the X-axis. In one embodiment each of the two lever arms 110 and 112 have the same length. However, in the embodiment shown in FIG. 2, the lever arm 110 has a shorter length than lever arm 112. Two structural windows 114 and 116 are provided in each lever arm 110 and 112, respectively, to further facilitate torsional bending of the lever arms 110 and 112. The portions between the window 114 and the edges of the semiconductor layer 106 define a spring arm 111. Similarly, the portions between the window 116 and the edges of the semiconductor layer 106 define a spring arm 113. A combination of the spring arms 111 and 113 and a pivoting action of the lever arms 110 and 112, described below, provide the torsional bending of the lever arms when the lever arms 110 and 112 are subjected to a force. The dimensions (lengths, widths, and thicknesses) of the spring arms 111 and 113 are one factor that determines the amount of torsional bending of the lever arms 110 and 112 that can occur for a given force. Specifically, longer/thinner spring arms 111 and 113 bend more, while shorter/thicker spring arms 111 and 113 bend less for the same applied force. Therefore, flexibility is provided by design of the spring arms 111/113 that can be used to achieve the desired sensitivity. Another factor is the lengths of the lever arms 110/112. The longer the lever arms 110/112, the more torsional bending when the edges of the lever arm are subject to a given force.

The pivot member 108 has a vertical support section 118. The pivot member 108 is integrally formed with the bottom side of the semiconductor layer 106 and provides the pivoting function in conjunction with the spring arms 111 and 113. The pivot member 108 can also include a top horizontal support section, not shown, under the semiconductor layer 106 to form a "T" shaped pivot member. The length of the top horizontal support section can range from covering a small portion of the bottom side of the semiconductor layer 106 to almost the entire width of the semiconductor layer 106. The length of the top horizontal support section can affect whether the semiconductor layer 106 is allowed to twist about the pivot member 108 or only pivot about the pivot member 108. In one embodiment, extra material can also be integrally provided to form a bottom horizontal support section, not shown, with the substrate/isolation layer 102/104 to form an "I" shaped pivot member. The height of the vertical support section 118 determines capacitances of a pair of capacitors. An example of the material of the pivot member 108 is undoped polysilicon.

Two sensing electrodes 122 and 128 are provided over the isolation layer 104 and below the semiconductor layer 106. The sensing electrodes 122 and 128 extend in the "Y" direction substantially the entire width of the semiconductor layer 106. The sensing electrodes 122 and 128 provide electrical connectivity, not shown, to the stimulus/response circuit 20 by, e.g., bond pads and bond wires in a manner known in the art. Two biasing electrodes 124 and 126 provide electrical connectivity to a conductor member 130. In the embodiment depicted in FIG. 2, the biasing electrodes 124 and 126 are placed on opposite sides of the isolation layer 104. However, in another embodiment both biasing electrodes 124 and 126 can be placed on the same side. In the embodiment shown in FIG. 2, the conductor member 130 is provided on the top surface of the semiconductor layer 106. In other embodiments, the conductor member 130 can be embedded in the semiconductor layer 106 or be provided at the bottom surface of the semiconductor member 106. In any of these embodiments, ends 132 and 134 of the conductor member 130 are electrically coupled to the biasing electrodes 124 and 126, respectively.

The conductor 130 includes a lateral portion 142 and axial portions 144. Lateral portion 142 of the conductor member 130 crosses the longitudinal axis, e.g., the "X" axis, at a distance 136 away from the pivot member 108, associated with only one of the two spring arms 111 and 113 (spring arm 113, as shown in FIG. 2). The distance 136 determines the amount of pivot the spring arm would be subjected to as a result of a Lorentz force generated which has a vector that is parallel with the "Z" axis, discussed in greater detail below.

The sensing electrodes 122 and 128 provide capacitor layers beneath capacitor portions 204 and 202 (shown in FIG. 3) of the lever arms 112 and 110 respectively. The combination of the sensing electrode 122 and the capacitor portions 204 forms a capacitor 140, shown in phantom. Similarly, the combination of sensing electrode 128 and the capacitor portions 202 forms a capacitor 138. The capacitance of each capacitor is defined by:

$$C = \varepsilon \frac{A}{d} \tag{1}$$

where $\varepsilon$ is permittivity of a dielectric,
A is the effective area defined by the areas of the sense electrode 122/128 and the capacitor portions 204 and 202, i.e., where charges collect,
and d is the distance between the sense electrodes 122/128 and the capacitor portions 202/204. In one embodiment, the dielectric is air. Since the capacitance is inversely proportional to the distance between the sense electrodes 122/128 and the capacitor portions 202/204, bending of a capacitor portion toward the sense electrodes 122/128 increases the capacitance. Conversely, bending of a capacitor portion away from the sense electrodes 122/128 decreases the capacitance.

The pivoting action of the semiconductor layer 106 about the pivot member 108 is such that if a force is acting on one of the lever arms 110/112, causing that lever arm to deflect downward toward the respective sense electrode, then the other lever arm moves in an opposite direction, i.e., away from its respective sense electrode. Such a relationship in deflections of the lever arms 110/112 is similar to a teeter-tooter mechanism. For example, if a downward force is acting on the lever arm 112 causing the lever arm 112 to deflect downward toward the sense electrode 122, the lever arm 110 deflects upward away from the sense electrode 128, or vice versa. An imbalanced force is needed, e.g., a summation of force applied on one of the lever arms to cause the teeter-tooter mechanism. Thus, for inertial/acceleration sensing where both the lever arms experience the same force density, geometrical design parameters, e.g., length of lever arms 110/112, can be used to generate the imbalanced force needed to cause the teeter-tooter mechanism. For example, one lever arm, e.g., 112, is longer than the other lever arm, e.g., 110. By implementing different lengths for the two lever arms 110/112, different motions can be generated.

Variations in deflections between the two lever arms 110 and 112 can be translated into variation in capacitances of the capacitors 138 and 140. These variations can then be sensed using electrical circuitry as will be discussed in greater detail, below.

Figure 3:
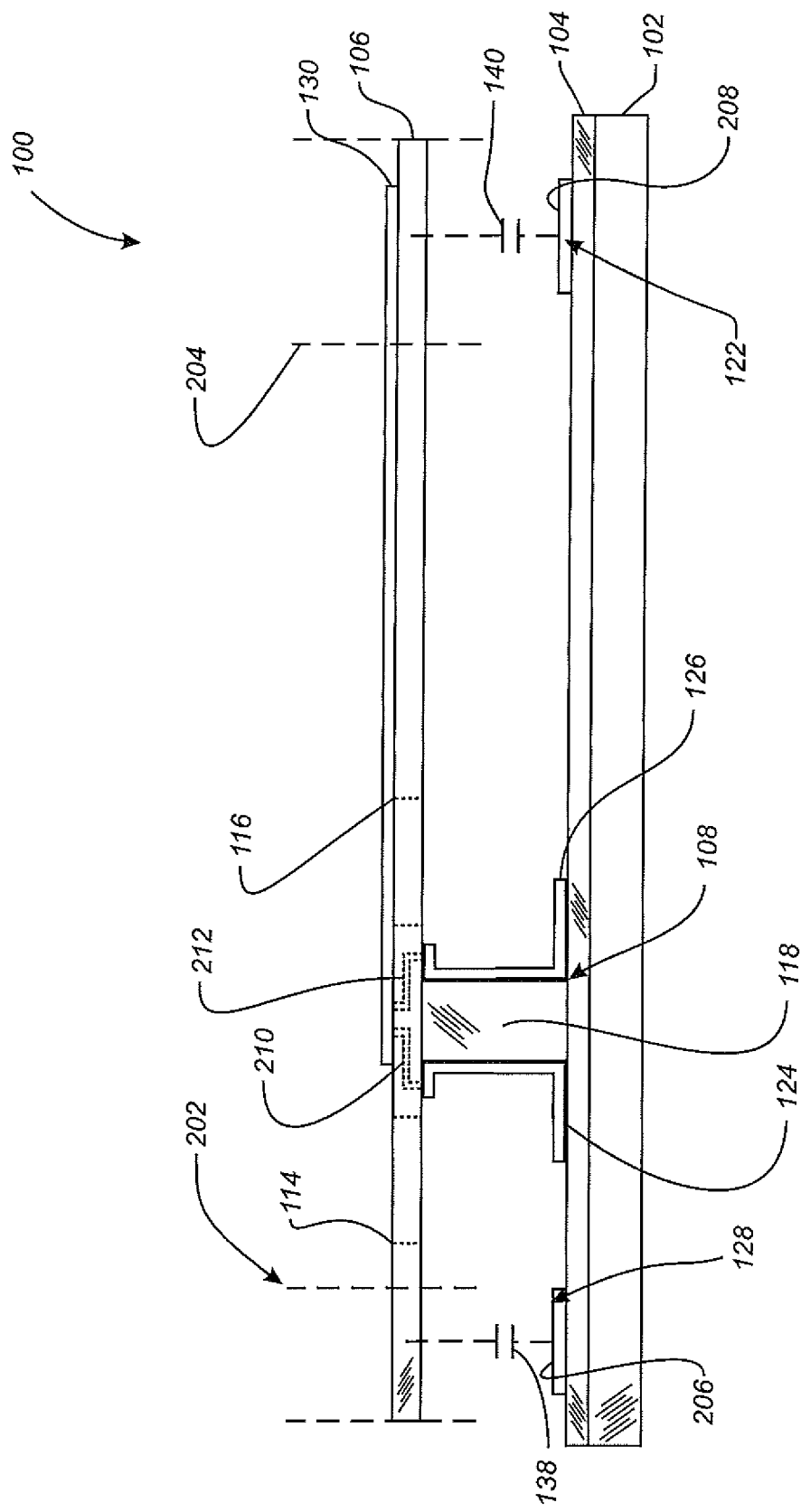
FIG. 3 depicts a side view of the MEMS sensor depicted in FIG. 2.

Referring to FIG. 3, a side view of the MEMS sensor 100 is provided. The capacitor portions 202 and 204 are depicted as part of lever arms 110 and 112. As discussed above, the sensing electrodes 122 and 128 provide capacitor layers 208 and 206 beneath the capacitor portions 202 and 204 of the lever arms 110 and 112, respectively. The combination of the capacitor layer 206 and capacitor portion 202 forms the capacitor 138. Similarly, the capacitor layer 208 and the capacitor portion 204 forms the capacitor 140.

As depicted in FIG. 3, the ends 132 and 134 of the conductor member 130 are electrically connected to the biasing electrodes 124 and 126 by way of vias 210 and 212. The biasing electrodes 124 and 126 include horizontal sections and vertical sections. The vertical sections are connected to the vias 210 and 212. In the embodiment where the conductor member 130 is on the bottom side of the semiconductor layer 106, the vias 210 and 212 can be avoided.

In operation, electric current is applied to the conductor member 130 by way of the biasing electrodes 124 and 126 through the vias 210 and 212. When the MEMS sensor 100 is placed in a magnetic field with magnetic field vectors tangential to the surface of the semiconductor layer 106, a vertical force due to the Lorentz force law is generated. The Lorentz force law states that when a charge carrying particle is in the presence of a magnetic field, the Lorentz force applied to the particle is expressed as $$F=q[E+(v \times B)] \quad (2)$$

where F is the Lorentz force in Newtons,
q is the charge of the charge carrying particle in coulombs,
v is the instantaneous velocity in m/s,
E is the electric field in v/m, and
B is the magnetic field in Tesla. The "x" is the vector cross-product between v and B. In a current-carrying conductor wire, the applying Lorentz force is expressed as:

$$F=L(i \times B) \quad (2a)$$

where F is the Lorentz force in Newtons,
L is the length of the current-carrying wire subject to the magnetic field in meters,
i is the electric current through the wire subject to the magnetic field in Amperes,
B is the magnetic field in Tesla. If the current that is passing through a conductor that is subjected to a magnetic field has a frequency near the resonance frequency of the free-standing structure, including lever arms 110 and 112, the amount of force applied to that structure would be amplified. Conversely, frequencies away from the resonance frequency would result in minimal forces. Therefore, in order to take advantage of the Lorentz force law and selectively test for a magnetic field affecting a conductor, an AC signal with a frequency near the resonance frequency of the structure can be used.

The direction of the Lorentz force is based on the right hand rule, known in the art. Depending on the direction of the magnetic field, the Lorentz force can apply to different portions of the conductor member 130. For example, if the magnetic field is parallel to the X-axis, the Lorentz force only applies to portions of the conductor member that are parallel with the Y-axis, e.g., the lateral portion 142 of the conductor member 130. However, if the magnetic field strikes the semiconductor layer 106 at a different angle, the Lorentz force may apply to different portions of the conductor member 130. Application of the Lorentz force to the lateral portion 142 of the conductor member causes the lever arm 112 to deflect downward toward the sense electrode 122. The downward deflection of the spring arm 113 also causes upward deflection of the lever arm 110 away from the sense electrode 128.

Application of current to the conductor element allows free charges to collect at both ends of the semiconductor layer 106. Free charges collect at both ends due to the semiconductor nature of the semiconductor layer 106. These charges lead to formation of the capacitor portions 202 and 204. The capacitor portions 202 and 204 in cooperation with capacitor layers 206 and 208 form capacitors 138 and 140. Deflection of the lever arm 112 toward the capacitor layer 208, i.e., sensor electrode 122, increases the capacitance of the capacitor 140. Deflection of the lever arm 110 away from the capacitor layer 206, i.e., the sense electrode 128, decreases the capacitance of the capacitor 138. A detection circuit, discussed in greater detail below, can be used to detect the changes in the capacitances.

While Lorentz forces can cause deflection of the lever arms 110 and 112 in opposite directions, perpendicular acceleration vectors, i.e., acceleration vectors in the "Z" direction, can generate forces to cause deflection of both lever arms 110 and 112 in the same direction. The inertial force that is generated is governed by Newton's second law of motion, i.e.

$$F=Ma \quad (3)$$

where M is the seismic mass of the lever arms;
a is the acceleration vector; and
F is the force vector acting on the lever arms. The direction of the force is the same as the acceleration vector. Therefore, with existence of the teeter-tooter action, when the MEMS sensor 100 is subjected to a perpendicular acceleration vector that is downward, the lever arm 112 deflects downward and lever arm 110 deflects upward. Conversely, when the MEMS sensor 100 is subjected to a perpendicular acceleration vector that is upward, the lever arm 112 deflects upward, and the lever arm 110 deflects downward. The teeter-totter action of the lever arms 110/112, just described, is substantially not present when lever arms 110 and 112 and spring arms 111 and 113 are constructed in the same fashion. For example, if the lever arms 110 and 112 have the same length and the spring arms 111 and 113 have the same thickness, then both lever arms deflect downward or upward depending on the direction of the acceleration vector. A difference in the above mentioned construction variables, can result in the teeter-totter action, described above.

Applying an electric current to the conductor member 130 facilitates in measuring capacitances generated by the capacitor portions 202 and 204 on the lever arms 110 and 112 forming capacitors 138 and 140. Deflection of the capacitor portion 202 and 204 toward the capacitor layers 206 and 208 increases capacitance of the capacitors 138 and 140. In the embodiment where one lever arm, e.g. the lever arm 112, is longer the capacitance of the respective capacitor, e.g., the capacitor 140, increases while the other capacitor, e.g., the capacitor 138, decreases. The difference in the change in capacitances can be used to determine the magnitude of the acceleration.

Passing an alternating current (AC) type signal through the conductor member 130, causes capacitive coupling of the AC signal through the capacitors 138 and 140. The interaction of the AC signal with a magnetic field that is parallel to the semiconductor layer 106, in particular the X-axis depicted in FIG. 2, can cause a deflection of the lever arm 112 according to the Lorentz law. If the frequency of the AC signal is near the resonance frequency the free-standing structure of the MEMS sensor 100, the deflection of the lever arms 110 and 112 can be maximized. By measuring the voltage at sense electrodes 128 and 122 and passing these voltages through a differential amplifier a $\Delta V$ quantity can be produced that relates to a magnetic field $\Delta B$ acting on the conductor member 130 and an acceleration vector $\Delta a$ acting on both lever arms 110 and 112. The $\Delta V$ quantity is expressed as:

$$\Delta V = S_A \Delta a + S_M \Delta B \quad (4)$$

where $\Delta V$ is the change in the output voltage measured in volts (V);
$\Delta a$ is the change in acceleration measured in m/s$^2$;
$\Delta B$ is the change in the magnetic field acting on the conductor member 130 and measure in Tesla (T);
$S_A$ is the sensitivity to acceleration measured in V/(m/s$^2$); and $S_M$ is the sensitivity to magnetic field measured in (V/T).

According to one embodiment, a pair of identical MEMS sensors $100_1$ and $100_2$ can be placed in the same inertial/magnetic environment with the $\Delta V_1$ and $\Delta V_2$ for the two sensors measured simultaneously. A first AC signal with a frequency near the resonance frequency of the free-standing structures of the MEMS sensors $100_1$ and $100_2$ spring arms 111 and 113 is applied to the biasing electrodes 124 and 126 of the first MEMS sensor $100_1$ and a second electric current is applied to the biasing electrodes 124 and 126 of the second MEMS sensor $100_2$. The first and second electric currents are opposite in direction, i.e., 180° phase shifted signals. $\Delta V$ values for each MEMS sensor $100_1$ and $100_2$ are measured. The $\Delta V$ measurement represents the differential voltage readout for the sense electrodes 128 and 122 with respect to the AC ground. Therefore, $\Delta V_1$ is the $\Delta V$ for the first MEMS sensor $100_1$ and $\Delta V_2$ is the $\Delta V$ for the second MEMS sensor $100_2$. In this embodiment, $\Delta B$ and $\Delta a$ are provided by the following proportionalities:

$$\Delta B \alpha (\Delta V_1 - \Delta V_2)/2 \quad (5a)$$

$$\Delta a \alpha (\Delta V_1 + \Delta V_2)/2 \quad (5b)$$

When the electric currents in MEMS sensors $100_1$ and $100_2$ are in opposite directions, the output voltage signals contributed by the magnetic field ($S_M \Delta B$) have opposite signs. On the other hand, the output voltage signals contributed by the acceleration vector ($S_A \Delta a$) are identical with no alternation. Therefore, $\Delta B$ can be calculated by the proportionality 5a by taking differential terms from the measured signals. Conversely, $\Delta a$ can be calculated by the proportionality 5b taking common terms from the measured signals. By using this measurement scheme, the magnetic field and acceleration vector applied to the MEMS sensor pair can be uncoupled and retrieved simultaneously.

In another embodiment, two identical MEMS sensors $100_1$ and $100_2$ can be placed in the same inertial/magnetic environment with the $\Delta V_1$ and $\Delta V_2$ for the two sensors measured simultaneously. A first AC signal with a frequency away from the resonance frequency of lever arms 110 and 112 is applied to the first MEMS sensor $100_1$ and a second AC signal with a frequency near or at the resonance frequency of the free-standing structure of the second MEMS sensor $100_2$. The frequency of the first AC signal does not result in any appreciable deflection of the lever arms 110 and 112 by way of the Lorentz force. $\Delta V_1$ and $\Delta V_2$ are measured for both MEMS sensors $100_1$ and $100_2$. $\Delta V_1$ is the $\Delta V$ for the first MEMS sensor $100_1$ and $\Delta V_2$ is the $\Delta V$ for the second MEMS sensor $100_2$. In this embodiment, $\Delta B$ and $\Delta a$ are provided by the following proportionalities:

$$\Delta B \alpha (\Delta V_2 - \Delta V_1) \quad (6a)$$

$$\Delta a \alpha \Delta V_1 \quad (6b)$$

When the pair of MEMS sensors $100_1$ and $100_2$ is exposed to a magnetic field, the lever arms 110 and 112 of the pair of MEMS sensors $100_1$ and $100_2$ behave differently. While the first AC signal applied to the first MEMS sensor $100_1$ causes no deflection for the free-standing structure exposed to a magnetic field, exposure to a perpendicular acceleration vector causes the free-standing structure to deflect. Therefore, an exposure to an acceleration vector $\Delta a$ can be calculated by the proportionality 6b. Conversely, the output voltage signal of the second MEMS sensor $100_2$ is subject to both magnetic field and acceleration vector because of the frequency selection of the AC current input. Therefore, using the output voltage signal from the MEMS sensor $100_1$ as reference, $\Delta B$ can be calculated by the proportionality 6a.

In accordance with another embodiment, one MEMS sensor 100 can be placed in an inertial/magnetic environment with the $\Delta V_1$ and $\Delta V_2$ for the sensor measured at different instances, i.e., at times t=$t_1$ and t=$t_2$. At the first instance, a first AC signal with a frequency away from the resonance frequency of the lever arms 110 and 112 is applied to the MEMS sensor 100. At the second instance a second AC signal with a frequency near or at the resonance frequency of the free-standing structure of the MEMS 100 is applied to the MEMS sensor 100. The frequency of the first AC signal does not result in any appreciable deflection of the lever arms by way of the Lorentz force. $\Delta V_1$ and $\Delta V_2$ are measured for both instances. Therefore, $\Delta V_1$ is the $\Delta V$ for the MEMS sensor 100 at the first instance and $\Delta V_2$ is the $\Delta V$ for the MEMS sensor 100 at the second instance. In this embodiment, $\Delta B$ and $\Delta a$ are provided by the following proportionalities:

$$\Delta B \alpha (\Delta V_2 - \Delta V_1) \quad (7a)$$

$$\Delta a \alpha \Delta V_1 \quad (7b)$$

When the MEMS sensor 100 is exposed to a magnetic field, the lever arms 110 and 112 of the MEMS sensors 100 behave differently at the two instances described above. While the first AC signal applied at the first instance causes no deflection for the free-standing structure exposed to a magnetic field, exposure of the lever arms 110 and 112 to a perpendicular acceleration vector causes the free-standing structure to deflect, e.g., downward. Therefore, $\Delta a$ can be calculated by the proportionality 7b. Conversely, the output voltage signal of the MEMS sensor 100 is subject to both magnetic field and acceleration vector because of the frequency selection of the AC current input. Depending on whether the MEMS sensor 100 is exposed to an acceleration vector, the lever arm 110 could deflect upward. Therefore, using the output voltage signal from the MEMS sensor 100 as a reference, $\Delta B$ can be calculated by the proportionality 7a.

In accordance with another embodiment, one MEMS sensor 100 can be placed in an inertial/magnetic environment with the $\Delta V_1$ and $\Delta V_2$ for the sensor measured at different instances, i.e., at times $t=t_1$ and $t=t_2$. At the first instance, a first AC signal with a frequency near or at the resonance frequency of the free-standing structure of the MEMS sensor 100 is applied to the MEMS sensor 100. At the second instance a second AC signal with a frequency near or at the resonance frequency of the free-standing structure of the MEMS sensor 100 is applied to the MEMS sensor 100. The first and second electric currents are opposite in direction, i.e., 180° phase shifted signals. $\Delta V$ for the MEMS sensor 100 is measured for each instance. $\Delta V_1$ is the $\Delta V$ for the MEMS sensor 100 at the first instance and $\Delta V_2$ is the $\Delta V$ for the MEMS sensor 100 at the second instance. In this embodiment, $\Delta B$ and $\Delta a$ are provided by the following proportionalities:

$$\Delta B \alpha (\Delta V_2 - \Delta V_1)/2 \quad (8a)$$

$$\Delta a \alpha (\Delta V_2 + \Delta V_1)/2 \quad (8b)$$

When the electric currents in MEMS sensor 100 are in opposite directions at different instances $t_1$ and $t_2$, the output voltage signals contributed by the magnetic field ($S_M \Delta B$) have opposite signs. On the other hand, the output voltage signals contributed by the acceleration vector ($S_A \Delta a$) are identical with no alternation. Therefore, $\Delta B$ can be calculated by the proportionality 8a by taking differential terms from the measured signals. Conversely, $\Delta a$ can be calculated by the proportionality 8b taking common terms from the measured signals. By using this measurement scheme, the magnetic field and acceleration vector applied to the MEMS sensor pair can be uncoupled and retrieved simultaneously.

Figure 4:
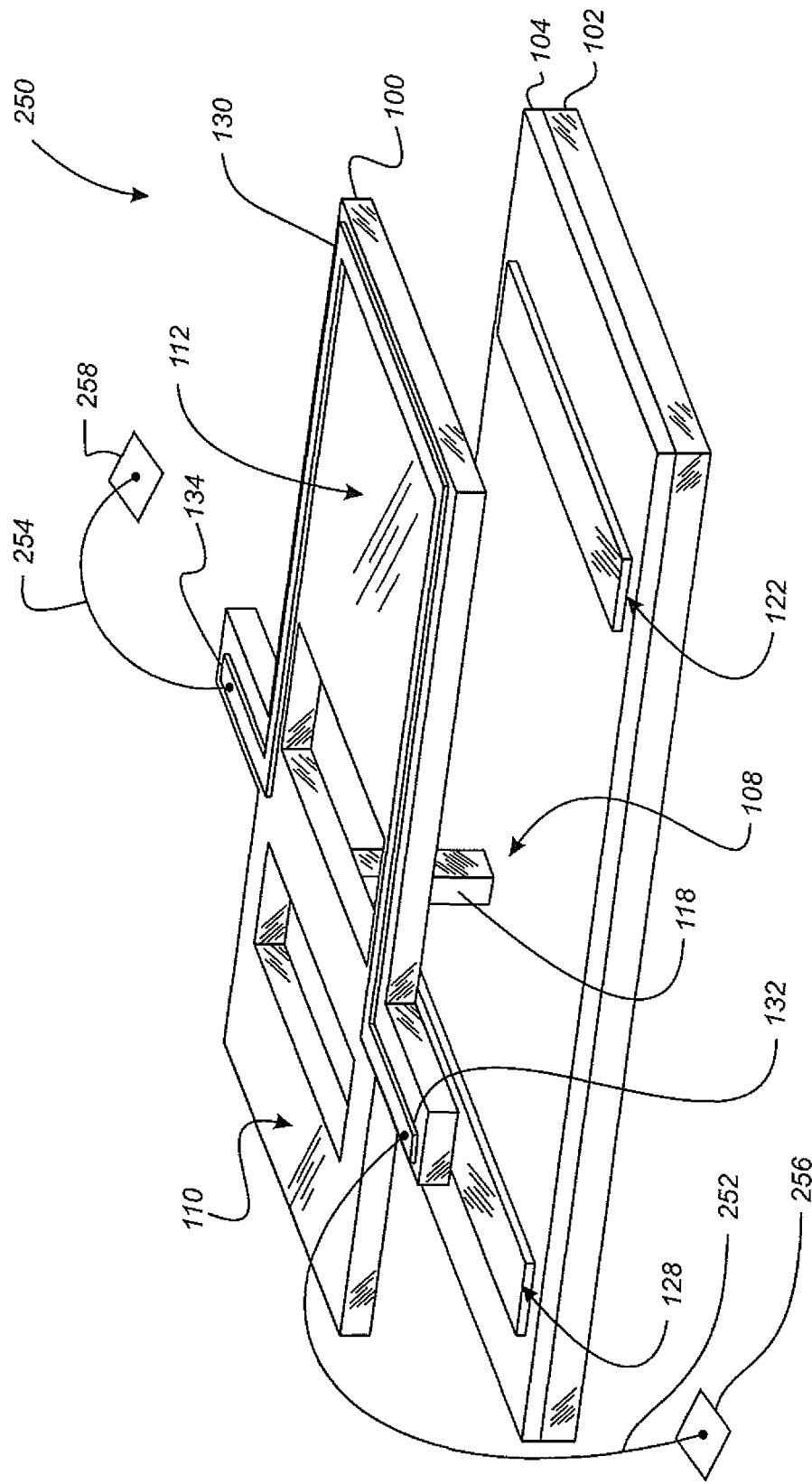
FIG. 4 depicts a perspective view of a MEMS sensor in accordance with one embodiment.

Referring to FIG. 4, a perspective view for an embodiment for a MEMS sensor 250 is depicted. In this embodiment, the conductor member 130 has ends 132 and 134 that extend outward over tabs 262 and 264. The bond pads 256 and 258 provide electrical connectivity between the stimulus/response circuit 20 and the conductor member 130, by way of bondwires 252 and 254 to pads (not shown) located on ends 132 and 134. In this embodiment, the biasing electrodes 124 and 126 and vias 210 and 212 can be eliminated.

Referring to FIGS. 5-14, steps involved in one embodiment for fabricating a MEMS sensor 100 are depicted. The steps depicted in these figures can be performed by integrated circuit fabrication processes that are known in the art. FIG. 5 depicts the substrate 102 and the isolation layer 104. The substrate 102 can be the starting point for a wafer which will include many MEMS sensors 100. Individual MEMS sensors 100 can later be diced and singulated from the wafer. As discussed above, examples of a suitable substrate material for the substrate 102 are silicon, glass, carbon, germanium, silicon carbide, and silicon germanium.

The isolation layer 104 is deposited onto the substrate 102 in order to electrically isolate the substrate 102 from other structures. Examples of suitable isolation material for the isolation layer 104 are silicon oxides, and silicon nitrides for the silicon substrate. Examples of methods of deposition are thermal growth (for silicon oxides), chemical vapor deposition, and physical vapor deposition. The isolation layer 104 is formed over the entire span of substrate 102 and may be on backside as well during the formation process.

Referring to FIG. 6, a deposition process is depicted for forming sense electrodes 122 and 128. A layer of a material 302 for forming the sense electrodes 122 and 128 is deposited on top of the isolation layer 104. Examples of methods of deposition are chemical vapor deposition and physical vapor deposition. This layer can alternatively be grown by an epitaxial growing process. Examples of material of the layer 302 are doped polysilicon, gold, silver, copper, titanium, platinum, tungsten, aluminum, iridium, ruthenium, and titanium nitride. The layer 302 is formed over the entire span of the isolation layer 104. Two strips of mask layers 304 are placed over the layer 302 for forming the sense electrodes 122 and 128. These layers can be produced by a photolithographic process known in the art. Once the mask layer 304 is formed, the layer 302 is etched away leaving the strips of layer 302 with the mask layer 304 on top. The mask layer 304 prevents etchants to etch away the strips under the mask layer 304. The mask layer 304 is then removed by a planarization process or a chemical removal process to leave two strips of the layer 302 which constitute sense electrodes 122 and 128.

Referring to FIG. 7, a sacrificial layer 306 is deposited/grown and patterned over the sense electrodes 122/128 as the foundation for forming the remainder of the MEMS sensor 100. A volume 307 of the sacrificial layer 306 corresponding to the position of the pivot member 108 is removed by a masking and chemical removal process. Referring to FIG. 8, a top view of the isolation layer 104, the sense electrodes 122/128, and the volume 307 is provided. Also depicted in FIG. 8 is the sacrificial layer 306. Referring to FIG. 9, formation of the pivot member 108 and the semiconductor layer 106 is depicted. A layer 310 is deposited/grown over the layer 306 and through the volume 307. Example of material of the layer 310 is polysilicon. It will be appreciated that the layer 310 constitutes the semiconductor layer 106 after the following processes. In addition, the pivot member 108 is now integrally formed with the isolation layer 104. The sacrificial layer 306 may be sufficiently thick to (1) induce a sufficiently large signal for mechanical-electrical transduction, (2) provide well-suited step coverage over the sacrificial layer 306, and (3) provide ease of release after stripping the sacrificial layer 306 to avoid issues such as stiction on ground, known in the art.

Referring to FIG. 10, a conductor layer 312 is deposited and patterned on the semiconductor layer 106 to form the conductor member 130 with the desired shapes as depicted in FIGS. 2 and 4. Examples of methods of deposition are chemical vapor deposition and physical vapor deposition. Examples of material of the layer 312 are gold, silver, copper, titanium, platinum, tungsten, aluminum, iridium, ruthenium, and titanium nitride and the likes. For pattern transfer, a photolithographic process known in the art is used to realize an etch mask to facilitate structuring of the conductor layer 312 with standard wet etching or lift-off process.

Referring to FIG. 11, the semiconductor layer 106 is structured to form the lever arms 110/112 and the spring arms 111/113. Structuring of the semiconductor layer 106 incorporates standard wet or dry etching process with use of etch mask produced by a photolithographic process known in the art. During wet or dry etching, part of the layer 310 not covered by the etch mask are etched away. The etch mask also covers the conductor member 130 which is placed on top of lever/spring arm 111/113, thus protects the conductor member 130 through the etching process of the semiconductor layer 310. Referring to FIGS. 12 and 13, top views of the semiconductor layer 106, pivot member 108, the sense electrodes 122/128, and the conductor member 130, with pattern according to FIGS. 2 and 4, are depicted. The alternative design depicted in FIG. 13 which corresponds to FIG. 4 can be realized by transferring different patterns of the etch masks that are used for structuring the semiconductor layer 310. Referring to FIG. 13, tabs 262 and 264, seen in the embodiment depicted in FIG. 4, can be formed simultaneously with the lever arms 110/112 and the spring arms 111/113 when structuring the semiconductor layer 310 using standard wet or dry etching process.

Referring to FIG. 14, the complete MEMS sensor 100 is depicted after removing all the etch masks by a planarization process or a chemical removal process. Furthermore, the sacrificial layer 306 is removed by a chemical etching process. In order to efficiently remove the sacrificial layer 306, the layer 310 may be perforated to allow the removal chemicals to reach the layer 306 in the vertical direction. Also, the open sides further assist the removal chemicals to reach the sacrificial layer 306 for effective removal of this layer. Undercuts (not shown) may occur under, e.g., the sense electrodes 122/128, in the final or the initial removal process of the sacrificial layer 306. However, providing the proper width and thickness ratios, the undercuts do not result in adverse performance issues of the MEMS sensor 100.

Figure 15:
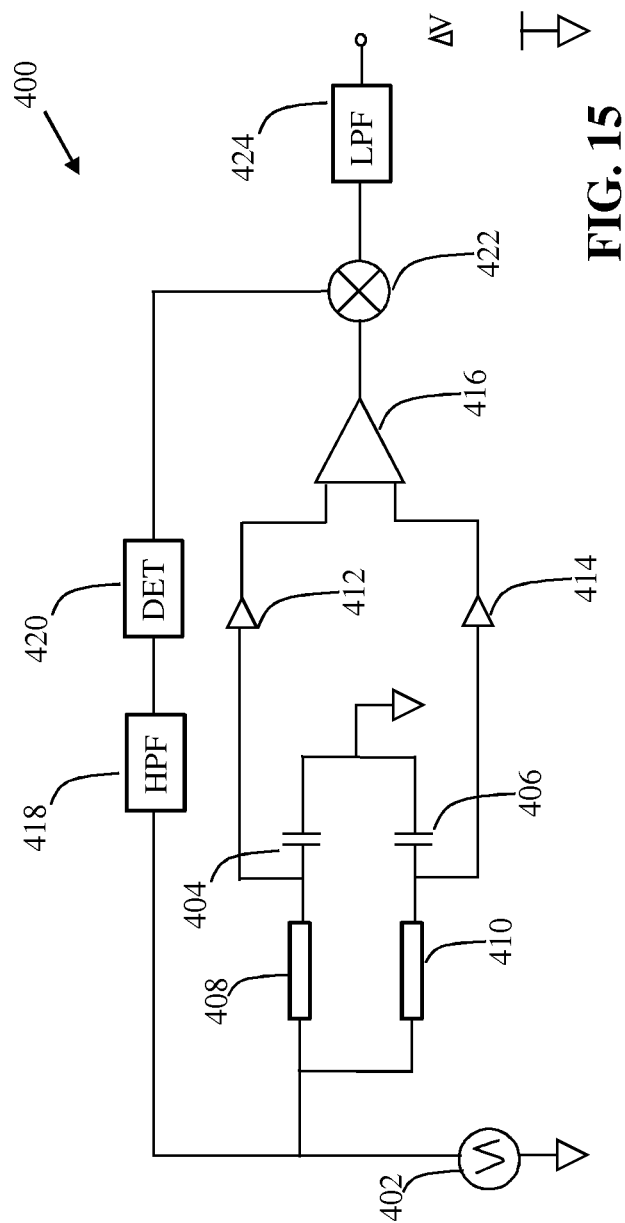
FIG. 15 depicts a schematic for measuring a $\Delta V$ associated with one MEMS sensor.

Referring to FIG. 15, an example of a simplified circuit diagram 400 is provided that can be used for measuring the $\Delta V$ and hence the change in capacitance associated with a MEMS sensor 100 which is subjected to an electrical signal. An AC component of a source 402 which is part of a carrier wave is coupled to the capacitors 404 and 406 through loads 408 and 410, respectively. Each capacitor is coupled to the AC ground. The high sides of each capacitor 404 and 406 are connected to AC amplifiers 412 and 414. The output of each AC amplifier is coupled to a differential amplifier 416. The source 402 is passed through a high pass filter 418 to remove its DC component. The remaining AC component is fed to a carrier detection circuit 420 to construct the carrier signal of the AC component of the source 402. The carrier signal is used to demodulate the output of the differential amplifier 416 by the demodulation block 422. The output of the demodulation block is then fed to a low pass filter 424 to generate the output $\Delta V$.

Referring to FIGS. 16 and 17, top views of matrices 500 and 550 of various MEMS sensors are depicted. The matrix 500 includes a pair of MEMS sensors 502 and 504 for measuring a magnetic field component tangential to a first longitudinal axis (X-axis), a pair of MEMS sensors 506 and 508 for measuring a magnetic field component tangential to a second longitudinal axis (Y-axis), and a sensor 510, known in the art, for measuring a magnetic field component tangential to the Z-axis (coming out of the page). The first and the second longitudinal axes are perpendicular to each other. The configuration depicted in FIG. 16 is suitable for measurement schemes, discussed above, that involve two MEMS sensors measuring $\Delta V$ simultaneously. Additional examples of the sensor 510 are Hall sensors, magento-resistance sensors, and other sensors known in the art.

The matrix 550 includes one MEMS sensor 552 for measuring a magnetic field component tangential to the first longitudinal axis (X-axis), one MEMS sensor 554 for measuring a magnetic field component tangential to the second longitudinal axis (Y-axis), and a sensor 556, known in the art, for measuring a magnetic field component tangential to the Z-axis (coming out of the page). Additional examples of the sensor 510 are Hall sensors, magento-resistance sensors, and other sensors known in the art. The configuration depicted in FIG. 17 is suitable for measurement schemes, discussed above, that involve one MEMS sensors measuring $\Delta V$ at two instances. The MEMS sensors depicted in FIGS. 16 and 17 are also capable of measuring acceleration vectors components that are tangential with the Z-axis (coming out of the page). Although not shown in FIGS. 16 and 17, known accelerometer sensors for measuring acceleration components tangential with X-axis and Y-axis can also be included on the matrices 500 and 550 for measuring the respective acceleration components.

In operation a magnetic field may not line up exactly with the X-axis or the Y-axis. However, the magnetic field components tangential to these axes are sensed by the respective MEMS sensors. By measuring the X-axis, the Y-axis, and the Z-axis components of the magnetic field and the acceleration vector the exact direction and magnitude of the magnetic field and the acceleration vector can be calculated based on known vector analysis.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

We claim:

1. A microelectromechanical system (MEMS) comprising:
 a substrate;
 a first pivot extending upwardly from the substrate;
 a first lever arm with a first longitudinal axis extending above the substrate and pivotably mounted to the first pivot for pivoting about a first pivot axis;
 a first capacitor layer formed on the substrate at a location beneath a first capacitor portion of the first lever arm;
 a second capacitor layer formed on the substrate at a location beneath a second capacitor portion of the first lever arm, wherein the first pivot supports the first lever arm at a location between the first capacitor portion and the second capacitor portion along the first longitudinal axis; and
 a first conductor member extending across the first longitudinal axis and spaced apart from the first pivot axis, wherein
 the first capacitor portion is spaced apart from the first pivot axis by a first distance;
 the second capacitor portion is spaced apart from the first pivot axis by a second distance; and
 the first distance is greater than the second distance.

2. The MEMS of claim 1, wherein the first conductor member is positioned on an upper surface of the first lever arm.

3. The MEMS of claim 2, further comprising:
 a first electrical biasing connection;
 a second electrical biasing connection;
 a first via extending between the first electrical biasing connection and a first end portion of the first conductor member for electrical coupling of the first electrical biasing connection and the first conductor member; and
 a second via extending between the second electrical biasing connection and a second end portion of the first conductor member for electrical coupling of the second electrical biasing connection and the first conductor member.

4. The MEMS of claim 1, further comprising:
 a memory in which command instructions are stored; and
 a processor configured to execute the command instructions to
 obtain a first voltage difference between the first capacitor layer and the first capacitor portion,
 obtain a second voltage difference between the second capacitor layer and the second capacitor portion, and
 provide an output associated with the strength of a first magnetic field extending along the first longitudinal axis based upon a difference between the first voltage difference and the second voltage difference.

5. The MEMS of claim 4, wherein the processor is further configured to execute the command instructions to:
provide an output associated with an acceleration of the first lever arm toward the substrate based upon a summation of the first voltage difference and the second voltage difference.

6. The MEMS of claim 1, wherein the first lever arm further comprises:
a base portion pivotably mounted to the first pivot;
a first spring arm portion extending between the base portion and the first capacitor portion; and
a second spring arm portion extending between the base portion and the second capacitor portion.

7. A microelectromechanical system (MEMS) comprising:
a substrate;
a first pivot extending upwardly from the substrate;
a first lever arm with a first longitudinal axis extending above the substrate and pivotably mounted to the first pivot for pivoting about a first pivot axis;
a first capacitor layer formed on the substrate at a location beneath a first capacitor portion of the first lever arm;
a second capacitor layer formed on the substrate at a location beneath a second capacitor portion of the first lever arm, wherein the first pivot supports the first lever arm at a location between the first capacitor portion and the second capacitor portion along the first longitudinal axis;
a first conductor member extending across the first longitudinal axis and spaced apart from the first pivot axis;
a second pivot extending upwardly from the substrate;
a second lever arm with a second longitudinal axis extending above the substrate and pivotably mounted to the second pivot for pivoting about a second pivot axis;
a third capacitor layer formed on the substrate at a location beneath a third capacitor portion of the second lever arm;
a fourth capacitor layer formed on the substrate at a location beneath a fourth capacitor portion of the second lever arm, wherein the second pivot supports the second lever arm at a location between the third capacitor portion and the fourth capacitor portion along the second longitudinal axis; and
a second conductor member extending across the second longitudinal axis and spaced apart from the second pivot axis.

8. The MEMS of claim 7, wherein the second longitudinal axis is perpendicular to the first longitudinal axis.

9. The MEMS of claim 7, wherein the second longitudinal axis is parallel to the first longitudinal axis.

10. A method of forming a microelectromechanical system (MEMS) comprising:
providing a substrate;
forming a first pivot extending upwardly from the substrate;
forming a first lever arm with a first longitudinal axis extending above the substrate to be pivotably mounted to the first pivot for pivoting about a first pivot axis;
forming a first capacitor layer on the substrate at a location selected to be beneath a first capacitor portion of the first lever arm;
forming a second capacitor layer on the substrate at a location selected to be beneath a second capacitor portion of the first lever arm, and selected such that the first pivot will support the first lever arm at a location between the first capacitor portion and the second capacitor portion along the first longitudinal axis; and forming a first conductor member to extend across the first longitudinal axis at a location and to be spaced apart from the first pivot axis, wherein:
the first capacitor portion is formed to be spaced apart from the first pivot axis by a first distance;
the second capacitor portion is formed to be spaced apart from the first pivot axis by a second distance; and
the first distance is greater than the second distance.

11. The method of claim 10, wherein the first conductor member is formed on an upper surface of the first lever arm.

12. The method of claim 11, further comprising:
forming a first electrical biasing connection;
forming a second electrical biasing connection;
forming a first via to extend between the first electrical biasing connection and a first end portion of the first conductor member for electrical coupling of the first electrical biasing connection and the first conductor member; and
forming a second via to extend between the second electrical biasing connection and a second end portion of the first conductor member for electrical coupling of the second electrical biasing connection and the first conductor member.

13. The method of claim 10, further comprising:
storing command instructions in a memory; and
configuring a processor to execute the command instructions to
obtain a first voltage difference between the first capacitor layer and the first capacitor portion,
obtain a second voltage difference between the second capacitor layer and the second capacitor portion, and
provide an output associated with the strength of a first magnetic field extending along the first longitudinal axis based upon a difference between the first voltage difference and the second voltage difference.

14. The method of claim 13, wherein configuring the processor further comprises configuring the processor to execute the command instructions to:
provide an output associated with an acceleration of the first lever arm toward the substrate based upon a summation of the first voltage difference and the second voltage difference.

15. The method of claim 10, wherein forming the first lever arm further comprises:
forming a base portion pivotably mounted to the first pivot;
forming a first spring arm portion extending between the base portion and the first capacitor portion; and
forming a second spring arm portion extending between the base portion and the second capacitor portion.

16. A method of forming a microelectromechanical system (MEMS) comprising:
providing a substrate;
forming a first pivot extending upwardly from the substrate;
forming a first lever arm with a first longitudinal axis extending above the substrate to be pivotably mounted to the first pivot for pivoting about a first pivot axis;
forming a first capacitor layer on the substrate at a location selected to be beneath a first capacitor portion of the first lever arm;
forming a second capacitor layer on the substrate at a location selected to be beneath a second capacitor portion of the first lever arm, and selected such that the first pivot will support the first lever arm at a location between the first capacitor portion and the second capacitor portion along the first longitudinal axis; and forming a first conductor member to extend across the first longitudinal axis at a location and to be spaced apart from the first pivot axis;

forming a second pivot to extend upwardly from the substrate;

forming a second lever arm with a second longitudinal axis to extend above the substrate to be pivotably mounted to the second pivot for pivoting about a second pivot axis;

forming a third capacitor layer on the substrate at a location selected to be beneath a third capacitor portion of the second lever arm;

forming a fourth capacitor layer on the substrate at a location selected to be beneath a fourth capacitor portion of the second lever arm, and selected so that the second pivot will support the second lever arm at a location between the third capacitor portion and the fourth capacitor portion along the second longitudinal axis; and forming a second conductor member to extend across the second longitudinal axis and to be spaced apart from the second pivot axis.

17. The method of claim 16, wherein the second longitudinal axis is perpendicular to the first longitudinal axis.

18. The method of claim 16, wherein the second longitudinal axis is parallel to the first longitudinal axis.

19. A microelectromechanical system (MEMS) comprising:

a substrate;

a first pivot extending upwardly from the substrate;

a first lever arm with a first longitudinal axis extending above the substrate and pivotably mounted to the first pivot for pivoting about a first pivot axis;

a first capacitor layer formed on the substrate at a location beneath a first capacitor portion of the first lever arm;

a second capacitor layer formed on the substrate at a location beneath a second capacitor portion of the first lever arm, wherein the first pivot supports the first lever arm at a location between the first capacitor portion and the second capacitor portion along the first longitudinal axis;

a first conductor member extending across the first longitudinal axis and spaced apart from the first pivot axis;

a memory in which command instructions are stored; and a processor configured to execute the command instructions to obtain a first voltage difference between the first capacitor layer and the first capacitor portion, obtain a second voltage difference between the second capacitor layer and the second capacitor portion, provide an output associated with the strength of a first magnetic field extending along the first longitudinal axis based upon a difference between the first voltage difference and the second voltage difference, and provide an output associated with an acceleration of the first lever arm toward the substrate based upon a summation of the first voltage difference and the second voltage difference.

20. A method of forming a microelectromechanical system (MEMS) comprising:

providing a substrate;

forming a first pivot extending upwardly from the substrate;

forming a first lever arm with a first longitudinal axis extending above the substrate to be pivotably mounted to the first pivot for pivoting about a first pivot axis;

forming a first capacitor layer on the substrate at a location selected to be beneath a first capacitor portion of the first lever arm;

forming a second capacitor layer on the substrate at a location selected to be beneath a second capacitor portion of the first lever arm, and selected such that the first pivot will support the first lever arm at a location between the first capacitor portion and the second capacitor portion along the first longitudinal axis; and forming a first conductor member to extend across the first longitudinal axis at a location and to be spaced apart from the first pivot axis;

storing command instructions in a memory; and configuring a processor to execute the command instructions to obtain a first voltage difference between the first capacitor layer and the first capacitor portion, obtain a second voltage difference between the second capacitor layer and the second capacitor portion, provide an output associated with the strength of a first magnetic field extending along the first longitudinal axis based upon a difference between the first voltage difference and the second voltage difference, and provide an output associated with an acceleration of the first lever arm toward the substrate based upon a summation of the first voltage difference and the second voltage difference.

\* \* \* \* \*